United States Patent [19]

Ohnaka et al.

[11] Patent Number: 4,779,283
[45] Date of Patent: Oct. 18, 1988

[54] SEMICONDUCTOR LIGHT EMITTING DEVICE

[75] Inventors: Kiyoshi Ohnaka, Moriguchi; Jun Shibata, Sakai; Yoichi Sasai, Hirakata; Ichiro Nakao, Kadoma, all of Japan

[73] Assignee: Matsushita Electric Industrial Co., Ltd., Osaka, Japan

[21] Appl. No.: 854,753

[22] Filed: Apr. 21, 1986

[30] Foreign Application Priority Data

Apr. 19, 1986 [JP] Japan ................................ 60-83743

[51] Int. Cl.⁴ ............................................. H01S 3/19
[52] U.S. Cl. ..................................... 372/46; 357/17; 357/19; 357/40; 372/50; 372/92
[58] Field of Search ................. 372/45, 46, 50, 47, 372/92; 357/17, 19, 40

[56] References Cited

U.S. PATENT DOCUMENTS 4,470,143  9/1984  Kitamura et al. .................. 372/50

FOREIGN PATENT DOCUMENTS 0085585  5/1985  Japan .................................. 372/46

OTHER PUBLICATIONS

"Electrical Derivative Characteristics of InGaAsP Buried Heterostructure Lasers", P. D. Wright et al., J. Appl. Phys. 53(3), Mar. 1982, pp. 1364–1372.

Primary Examiner—James W. Davie
Attorney, Agent, or Firm—Wenderoth, Lind & Ponack

[57] ABSTRACT

A semiconductor laser in which an InGaAsP active layer serving as light emitting layer and formed in the shape of a stripe on the surface of a flat InP first clad layer, and an InP second clad layer that is wider than the InGaAsP active layer and formed on the InGaAsP active layer are buried in an InP burying layer. The stripe direction is the <011> direction, an etched mirror is formed in the vicinity of the end of the active layer, and an opto-electronic integrated circuit is formed by integrating the electric device and photo detecting device on the same substrate. The substrate is a semi-insulating substrate, and the electric device and photo detecting device are formed on the InGaAsp or InGaAs layer formed on the InP burying layer by crystal growth.

6 Claims, 4 Drawing Sheets

SEMICONDUCTOR LIGHT EMITTING DEVICE

BACKGROUND OF THE INVENTION

This invention relates to a buried type semiconductor light emitting device which can be applied to an OEIC (opto-electronic integrated circuit).

The semiconductor laser is presently used as the light source of optical communications or optical disks, and it is expected to be further applied to OEIC and others. However, since the usual semiconductor employs the cleavage surface as resonator, the length of one side of a chip is limited by the resonator length, and it is difficult to integrate other elements. For example, if the laser's resonator length is 200 μm, the length of one side of an OEIC is 200 μum, and when it is attempted to integrate four electric elements, the length of other side must be 1 mm. When integrated further, the slender ratio of the chip becomes greater, which makes it difficult to divide or assemble chips. While the laser to form the resonator by etching is also being developed satisfactory resonators are not available at the present time.

As an example of a conventional semiconductor laser, a buried type semiconductor laser is known (see the Journal of Applied Physics, Vol. 53, pages 1364–1372, 1982), and it has the following advantages.

(a) Since the InGaAsP active layer is surrounded by InP which has a low refractive index, the light is enclosed, and the laser is oscillated at a low threshold current.

(b) Since the p-type InGaAsP contact layer is wider than the InGaAsP active layer, the contact resistance with the Au/Zn electrode may be lowered.

In spite of these advantages, the conventional buried type semiconductor laser involves the following points to be considered.

(a) In the reverse means shape forming, there is no reproducibility of the shape. That is, the width of InGaAsP active layer is determined by the width of p-type InGaAsP contact layer and thickness of p-type InP clad layer, and if the thickness of the p-type InP clad layer fluctuates, the width of the InGaAsP active layer also varies, which results in a defective characteristic.

(b) In the crystal growth of burying the reverse mesa shape in the p-type InP block layer and n-type InP buried layer, the side of the InGaAsP active layer is damaged by heat, which may cause a reduction in the quantum efficiency or an increase in the leakage current.

(c) Since the stripe direction is <011> directions, that is, the resonator surface is (011) surface, the etched mirror cannot be formed by chemical etching.

SUMMARY OF THE INVENTION

It is hence a primary object of this invention to present a semiconductor light emitting device a structure wherein the resonator surface can be formed by etching.

It is another object of this invention to present a semiconductor light emitting device having a structure wherein the side of active layer is not damaged by heat.

It is a further object of this invention to present a semiconductor light emitting device having a structure wherein the width of the active layer may be formed with relatively high precision.

These and other objects are accomplished by a semiconductor light emitting device which comprises a first clad layer, an active layer formed in stripes in the <011> direction on the surface of the first clad layer, a second clad layer formed on the active layer which is wider than the active layer, a unilateral conductive burying layer formed on the first clad layer in a manner to enclose the active layer and second clad layer, and an etched mirror formed on the outside of the end of the active layer.

In a specific embodiment, the first clad layer is formed on the surface of a semi-insulating substrate. An impurity diffused layer is formed in a manner to contact with one side of the second clad layer. The etched mirror is formed inside the first clad layer and burying layer.

This invention also relates to a semiconductor light emitting device which comprises a first clad layer, an active layer formed in stripes on the first clad layer, a second clad layer formed on the active layer which is wider than the active layer, and a burying layer formed on the first clad layer in a manner to enclose the active layer and second clad layer.

This invention further relates to a semiconductor light emitting device which comprises a semi-insulating InP substrate of which principal surface is (100) surface, a first clad layer of unilateral conductive type InP formed on the surface of this substrate, an InGaAsP active layer serving as a light emitting layer formed in stripes and having a length extending in the $<01\bar{1}>$ direction on the surface of the first clad layer, a second clad layer of the opposite unilateral conductive type InP formed on the active layer which is wider than the active layer, a burying layer of unilateral conductive InP in which the active layer and second clad layer are buried, an etched mirror formed outside of the end of the stripe shaped active layer, and at least one of electric element and photo detecting element formed on the substrate.

According to the present invention as described herein, the following advantages, among others, are obtained:

(1) Since the stripe shaped active layer can be formed in the <011> direction, the vicinity of the end of active layer can be formed into a mirror for resonator by etching, so that the semiconductor light emitting device may be manufactured easily.

(2) Since the clad layer formed on the active layer is wider than the active layer, a recess is formed at the side of active layer, so that heat damage may be reduced.

(3) Since the width of active layer can be controlled relatively accurately by the width of second clad layer, uniform devices may be presented.

While the novel features of the invention are set forth with particularity in the appended claims, the invention, both as to organization and content, will be better understood and appreciated, along with other objects and features thereof, from the following detailed description taken in conjunction with the drawings, in which:

BRIEF DESCRIPTION ON THE DRAWINGS

Figure 4:
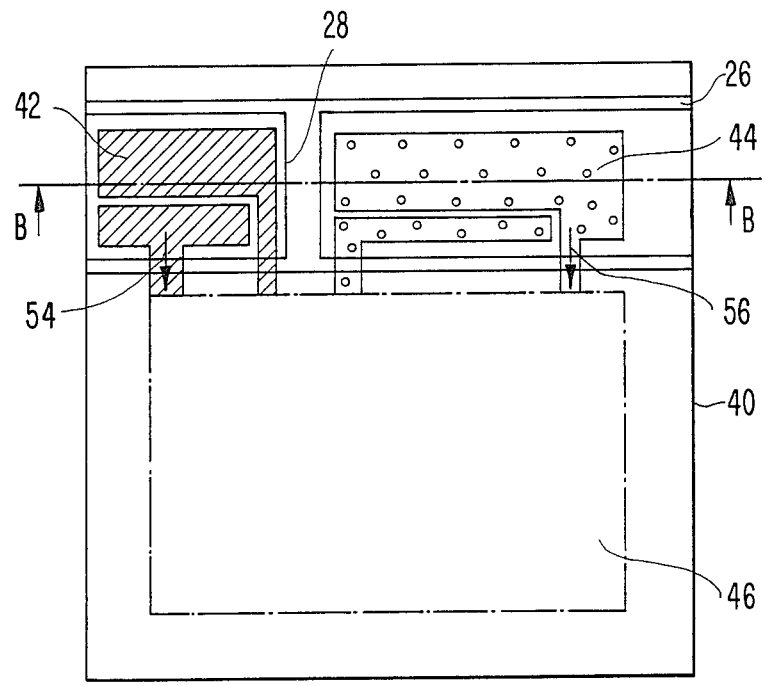
Figure 5:
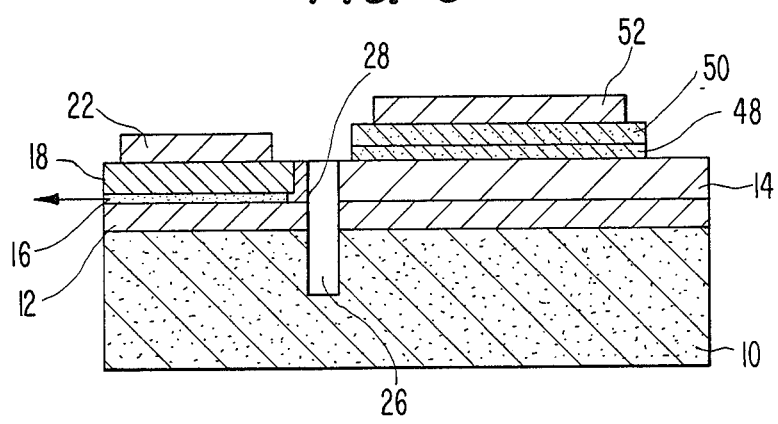
Figure 6:
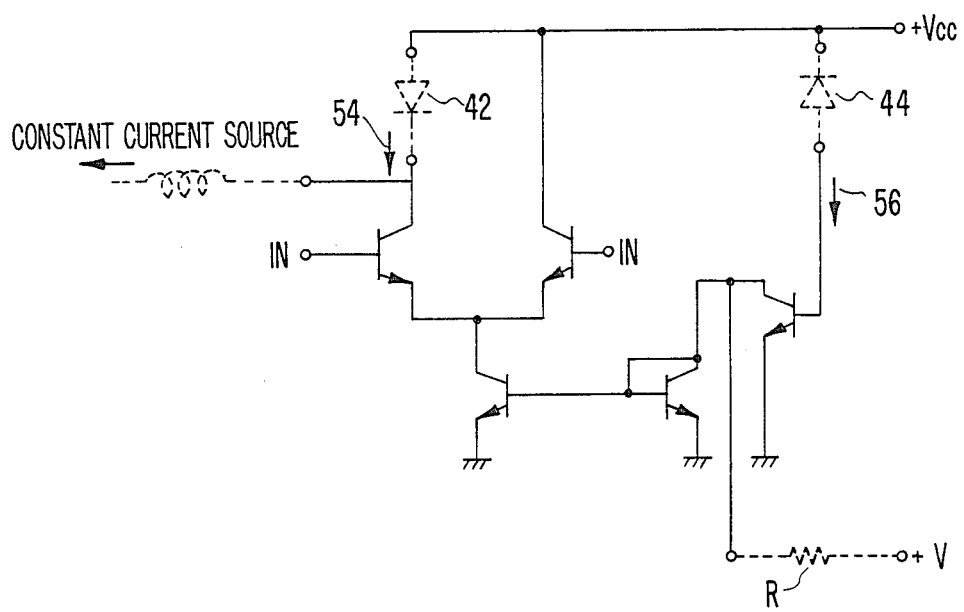

FIGS. 3(a)–3(d) illustrate the manufacturing method of said semiconductor laser;

FIG. 4 is a schematic plan view of OEIC in a state where the same semiconductor layer is incorporated in the OEIC:

FIG. 5 is a sectional view of said OEIC taken along the line B—B of FIG. 4;

FIG. 6 is an equivalent circuit diagram of said OEIC; and

Figure 7:
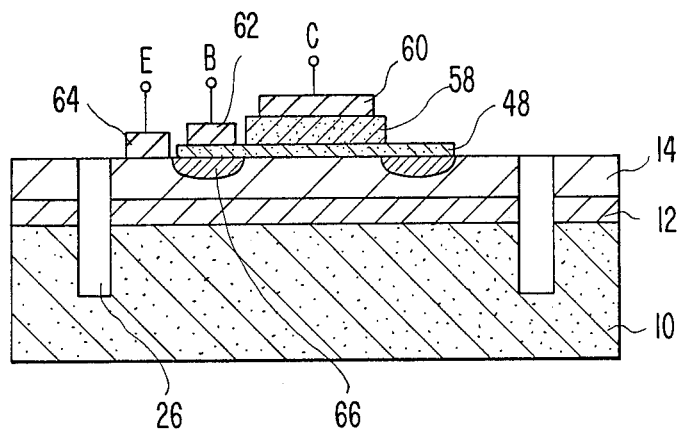

FIG. 7 is a sectional view showing a modified embodiment of said OEIC.

DETAILED DESCRIPTION OF THE PREFERRED EMBODIMENT

Figure 1:
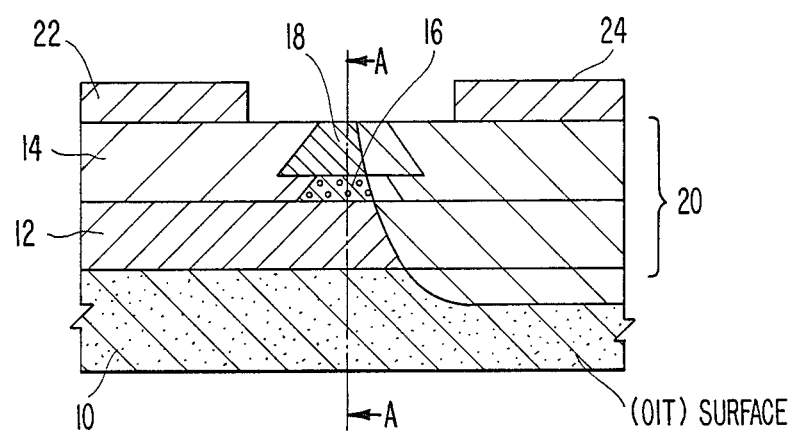
FIG. 1 is a sectional view of a semiconductor laser as one of the embodiments of this invention.

FIG. 1 shows a semiconductor layer in one of the embodiments of this invention, wherein an n-type first clad layer 12 and an n-type InP burying layer 14 are sequentially formed on a semi-insulating InP substrate 10. In the burying layer 14, InGaAsP active layer 16 and p-type InP second clad layer 18 are sequentially formed. Contacting one side of InGaAsP active layer 16 and p-type InP second clad layer 18, is a p-type diffused layer 20 formed across the substrate 10 with first clad layer 12 and buried layer 14. An Au/Sn electrode 22 is an electrode for burying layer 14, and an Au/Zn electrode 24 is an electrode for p-type diffused layer 20.

Figure 2:
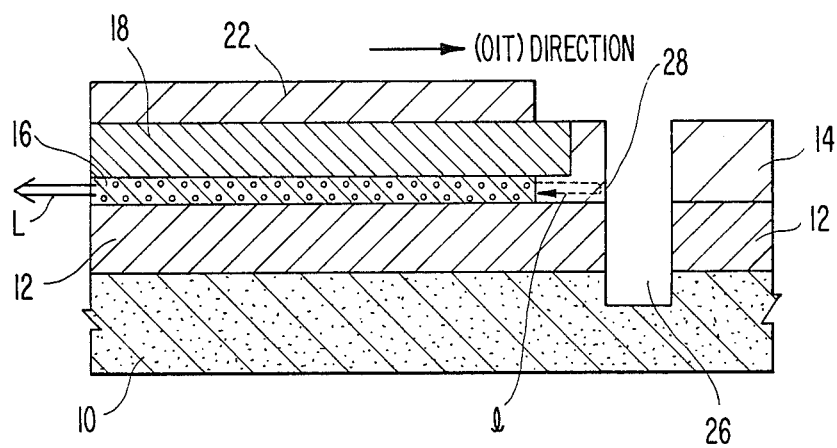
FIG. 2 is a sectional view of said semiconductor laser taken along the line A—A of FIG. 1.
Figure 3A:
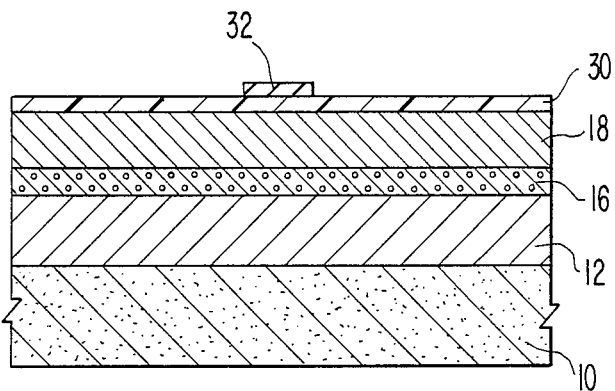
Figure 3B:
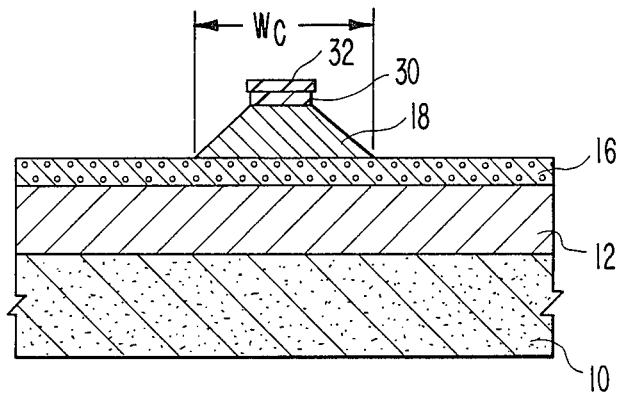
Figure 3C:
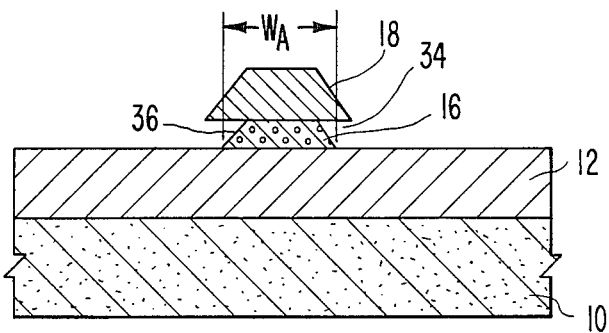
Figure 3D:
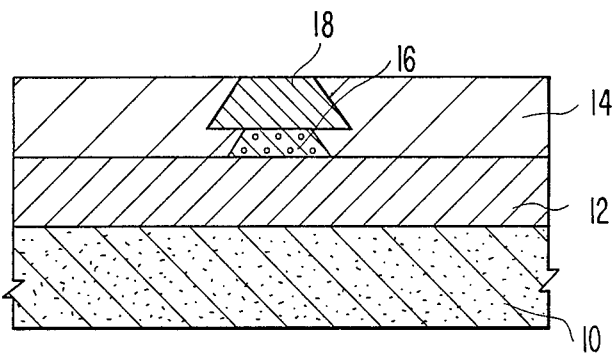

FIG. 2 is a sectional view taken along line A—A of FIG. 1, in which a ditch 26 is formed by etching, and an etched mirror 28 is formed outside the end of InGaAsP active layer 16. The surface of this mirror 28 is (01$\bar{1}$) surface, and the longitudinal direction of the stripe shaped active layer 16 and second clad layer 18 is <01$\bar{1}$> direction.

FIG. 3 shows the manufacturing process of semiconductor laser of this embodiment. In FIG. 3 (a), on the surface of semi-insulating InP substrate 10 of which principal surface is (100) surface, the n-type InP first clad layer 12 (thickness t=1 μm, carrier density $N_D - N_A = 5 \times 10^{17}$ cm$^{-3}$), InGaAsP active layer 16 (emitting light length λg=1.3 μm, t=0.1 μm), p-type InP second clad layer (t=1 μm, $N_A - N_D = 5 \times 10^{17}$ cm$^{-3}$), and InGaAsP cap layer 30 (λg=1.1 μm, t=0.1 μm) are formed sequentially by crystal growth by the liquid phase epitaxial (LPE) method, and furthermore, an Si$_3$N$_4$ film 32 is formed on the surface, and this Si$_3$N$_4$ film 32 is etched to have a stripe pattern in the <01$\bar{1}$> direction and a width of, for example, 2 μm.

Next, in FIG. 3 (b), using the Si$_3$N$_4$ film 32 as mask, the InGaAsP cap layer 30 is selectively etched by, for example, a mixed solution of H$_2$SO$_4$:H$_2$O$_2$:H$_2$O = 1:1:5. Furthermore, using the InGaAsP cap layer 30 as mask, the p-type InP second clad layer 18 is selectively etched, for example, by a mixed solution of HCl:H$_3$PO$_4$=1:4. The result is as shown in FIG. 3 (b). Here, the width W$_C$ of the lower end of the p-type InP second clad layer 18 is measured.

Then, in FIG. 3 (c), which the Si$_3$N$_4$ film 32, has been reemed the InGaAsP active layer 16 is selectively etched by, for example, a mixed solution of H$_2$SO$_4$:H$_2$O$_2$:H$_2$O = 1:1:5. Simultaneously, the InGaAsP cap layer 30 is removed, and a recess 34 is formed as shown in FIG. 3 (c). The width W$_A$ of InGaAsP active layer 16 is determined by W$_C$ and the time of selective etching. For example, if W$_C$=4 μm, by selectively etching for 30 minutes, W$_A$=2 μm may be formed.

Consequently, in FIG. 3 (d), when n-type InP buried layer 14 (t=1.1 μm, $N_D - N_A = 5 \times 10^{17}$ cm$^{-3}$) is formed on the surface by crystal growth by LPE method, InGaAsP active layer 16 and p-type InP second clad layer 18 are buried as shown in FIG. 3 (d), and the surface of the n-type InP burying layer 14 becomes completely flat. In this crystal growth, since the entire surface of the substrate is an etched crystal surface, it is not damaged, and crystal growth is effected with good reproducibility, and the boundary to the n-type InP burying layer 14 is also excellent. Incidentally, since the side face 36 of InGaAsP active layer 16 [see FIG. 3 (c)] is located within the side etched recess 34, it is rarely subjected to enough heat to cause damage, and the crystallinity of the side face of InGaAsP active layer 16 is in excellent condition, and the n-type InP burying layer 14 is developed by crystal growth.

Next, contacting the one side of p-type InP second clad layer 18 is a p-type diffused layer 20 formed, for example, by selectively diffusing Zn using the enclosed ampoule method. Furthermore, when Au/Zn electrode 24 and Au/Sn electrode 22 are formed on the surface of p-type diffused layer 20 and n-type InP burying layer 14, the buried type semiconductor layer of this embodiment is completed as shown in FIG. 1.

When forming this p-type diffused layer 20, as shown in FIG. 2, when the p-type diffused layer 20 is developed until it has reached the semi-insulating InP substrate 10, the pn junction area is decreased, that is, the junction capacitance is reduced, thereby enabling high speed operation of the laser device is. Moreover, in this embodiment, since an electrode is not formed on the InGaAsP active layer 16, deterioration of the InGaAsP active layer 16 due to the alloying of an electrode or its migration may be inhibited.

Furthermore, in this embodiment, when the length of the stripe of Si$_3$N$_4$ film 32 in FIG. 3 (a) is defined to a finite length, an n-type InP burying layer 14 may be also formed at the end of stripe of InGaAsP active layer 16 and p-type InP second clad layer 18. Accordingly, at the outside of the end of InGaAsP active layer 16, when selectively etched by, for example, a mixed solution of HCl:H$_3$PO$_4$=1:8, using, for example, Si$_3$N$_4$ film 32 as etching mask, an etched mirror 28 may be formed as shown in FIG. 2. When forming this etched mirror 28, since etching is done outside of the end of InGaAsP active layer 16, all the etched region is InP layer 14, and a perfectly flat etched mirror surface is formed. Furthermore, since the entire surface of the etched mirror 28 is of the identical conductive type, if a protective film or a reflection film is formed on the surface of etched mirror 28, an increase of junction leakage current, will not occur and electrical stability is maintained.

Meanwhile, in this embodiment, it is evident that the advantages of this invention are not diminished if an n-type InP second clad layer is used instead of the p-type InP second clad layer 18, and the p-type diffused layer 20 is formed so as to contact one side of the InGaAsP active layer 16.

In the description of this embodiment, the stripe is formed in the <01$\bar{1}$> direction, but if formed in the <011> direction, although the etched mirror may not be formed by chemical etching, the controllability of the active layer width is excellent, and a buried type semiconductor laser having a favorable boundary with the burying layer is produced.

Or, if the n-type or p-type InP substrate is used instead of a semi-insulating InP substrate, although the pn junction area increases, the controllability of the active layer width is excellent, and, again, a buried type semiconductor laser having a favorable boundary with the burying layer is produced.

An embodiment in which this invention is applied to an OEIC is shown in FIGS. 4 to 7. FIG. 4 is an overall view of an OEIC chip 40. This OEIC chip 40 incorporates a laser diode 42 with etched mirror 28, photo diode 44 for the monitoring of optical output, and an electronic circuit 46. These devices are electrically isolated by isolation well 26.

FIG. 5 is a sectional view taken along line B—B in FIG. 4, which shows the section of laser diode 42 and photo diode 44. The laser diode 42 has the same construction as the one shown in FIGS. 1, 2. The photo diode 44 is comprised of p-InGaAsP layer 48 formed on the n-InP burying layer 14 by crystal growth, and p-InGaAs layer 50 formed by diffusing p-type impurity, such as Zn, on the n-InGaAs layer formed on its surface by crystal growth. An Au/Zn electrode 52 is formed on the p-InGaAs layer 50. In this photo diode 44, the light emitted from the laser diode 42 is absorbed by the p-InGaAs layer 50 and is converted into an electric current.

The electronic circuit 46 contains drive circuits to drive the laser diode 42 and an automatic power control (APC) circuit for feeding back the output of the photo diode 44 to keep constant the output light from the laser diode 42. An example of its equivalent circuit is shown in FIG. 6, in which numerals 54, 56 denote drive current and monitor current, respectively.

FIG. 7 shows a sectional view of a unit cell of the transistor being used. The n-InP burying layer 14 is the emitter, and the p-InGaAsP layer 48 formed on the surface by crystal growth is the base, and the n-InGaAs layer 58 formed on its surface is the collector, thereby composing a hetero-bipolar transistor (HBT). At the collector, base, and emitter, Au/Sn electrode 60, Au/Zn electrode 62, and Au/Sn electrode 64 are formed, respectively. Beneath the base Au/Zn electrode 62, a p-InP graphed base diffusion layer 66 is formed, so that the injection of electrons from the emitter to the base immediately beneath the collector may be effected at high efficiency.

Thus, as clear from one of the embodiments of this invention applied into the OEIC, the degree of integration may be raised by this invention because the dimensional limitation of the OEIC chip is lifted, and the degree of freedom of designing may be dramatically enhanced. At the same time, it is easy to integrate the electric devices and photo detecting devices.

While specific embodiments of the invention have been illustrated and described herein, it is realized that other modifications and changes will occur to those skilled in the art. It is therefore to be understood that the appended claims are intended to cover all modifications and changes as fall within the true spirit of the invention.

What we claim is:

1. A semiconductor light emitting device comprising:
   a first clad layer;
   an active layer having the shape of a stripe and extending along a surface of said first clad layer in the $<01\bar{1}>$ direction;
   a second clay layer disposed on a surface of said active layer, said second clad layer being wider than said active layer;
   a burying layer disposed on said first clad layer and surrounding sides of both said active layer and said second clad layer so that said active layer and said second clad layer are located in said burying layer;
   a resonant cavity including an etched mirror, said etched mirror integral with said burying layer and disposed adjacent an end of said active layer; and
   electrodes operatively electrically connected to said active layer for passing current to said active layer.

2. A semiconductor light emitting device as claimed in claim 1,
   and further comprising a semi-insulating substrate on which said first clad layer is disposed.

3. A semiconductor light emitting device as claimed in claim 1,
   and further comprising an impurity diffusion layer contacting one of said sides of second clad layer.

4. A semiconductor light emitting device comprising:
   a semi-insulating InP substrate having a principal surface that is the (100) surface;
   an InP first clad layer of one conductive layer disposed on a surface of said substrate;
   an InGaAsP active light emitting layer having the shape of a stripe and extending along a surface of said first clad layer in the $<01\bar{1}>$ direction;
   an InP second clad layer of the other conductive type disposed on said active layer, said second clad layer being wider than said active layer;
   an InP burying layer of one conductive type in which said active layer and said second clad layer are embedded;
   a resonant cavity including an etched mirror, said etched mirror integral with said burying layer and disposed adjacent an end of said stripe-shaped active layer;
   electrodes operatively electrically connected to said active layer for passing current to said active layer; and
   at least one of an electric device and a photo-detecting device disposed on said substrate.

5. A semiconductor light emitting device as claimed in claim 4,
   and further comprising an InGaAsP layer of the other conductive type and one of an InGaAs and an InGaAsP layer of one conductive type disposed on said InP burying layer, and
   wherein said at least one of an electric device and a photo-detecting device is said electric device, said electric device being a hetero-bipolar transistor using said InGaAsP layer of the other conductive type, said one of an InGaAs and an InGaAsP layer, and said InP burying layer as base, collector and emitter, respectively.

6. A semiconductor light emitting device as claimed in claim 4,
   and further comprising one of an InGaAsP and an InGaAs layer of the other conductive type disposed on said InP burying layer, and
   wherein said at least one of said electric device and said photo-detecting device comprises said photo-detecting device, said photo-detecting device comprising a pn junction.

* * * * *